United States Patent [19]

Josephs et al.

[11] Patent Number: 4,458,160

[45] Date of Patent: Jul. 3, 1984

[54] HIGH GAIN JOSEPHSON JUNCTION VOLTAGE AMPLIFIER

[75] Inventors: Richard M. Josephs, Willow Grove; Tsing-Chow Wang, Norristown, both of Pa.

[73] Assignee: Sperry Corporation, New York, N.Y.

[21] Appl. No.: 323,144

[22] Filed: Nov. 19, 1981

[51] Int. Cl.³ .............................................. H03K 3/38
[52] U.S. Cl. .................................... 307/306; 307/277; 330/63
[58] Field of Search ............... 307/245, 277, 306, 462, 307/476; 357/5; 365/162; 330/63, 62

[56] References Cited

U.S. PATENT DOCUMENTS

| | | | |
|---|---|---|---|
| 3,689,780 | 9/1972 | Meissner et al. | 307/306 |
| 4,117,354 | 9/1978 | Gheewala | 307/277 |
| 4,313,066 | 1/1982 | Gheewala | 307/306 |

*Primary Examiner*—John Zazworsky
*Attorney, Agent, or Firm*—John B. Sowell; Thomas J. Scott; Marshall M. Truex

[57] ABSTRACT

A single Josephson junction device is arranged in a single branch which comprises an external source resistor connected in series with an output resistor and a Josephson junction device. An input node and an input resistor are in series and connected to the node between the output resistor and the Josephson junction device. Voltage signals applied to the input voltage node are amplified by connecting a high gain voltage output in parallel with the output resistor and providing sensing means for sensing the voltage output across the output resistor only when the Josephson junction device is switching from its low impedance state to its high impedance state.

9 Claims, 8 Drawing Figures

HIGH GAIN JOSEPHSON JUNCTION VOLTAGE AMPLIFIER

BACKGROUND OF THE INVENTION

1. Field of the Invention

This invention relates to superconductive Josephson junction circuits. More particularly, the circuit relates to a novel Josephson junction voltage amplifier.

2. Cross Referenced to Related Applications

Our co-pending application Ser. No. 299,148 entitled "Three Josephson Junction Direct Coupled Isolation Circuit" is directed to an improvement fan-out current gain circuit capable of driving at least three identical output loads with a margin of safety to ensure proper operation.

3. Description of the Prior Art

The principal of operation of the above-mentioned circuit and other Josephson junction current gain circuits is based on current steering. It is well known that a Josephson junction device displays no impedance when the current passing through the junction is at a value less than the critical current $I_0$. When a value of critical current $I_0$ is reached, the Josephson junction becomes resistive and switches from the zero voltage state to the voltage gap state. The gap voltage for a Josephson junction remains constant and does not vary. When a constant current source is connected to a Josephson junction device, a major portion of that current can be steered or diverted to a parallel load or loads when the Josephson junction switches. The nature of a Josephson junction is that it either displays a voltage or no voltage; thus, by definition, it does not amplify an input voltage.

Josephson junction devices are classified as superconductive devices in U.S. Class 307, sub class 306. Josephson junction load drivers usually employ a plurality of parallel branches and a plurality of Josephson junction devices. All of these load drivers are limited to modest gain and modest fan-out. Circuits of this type are shown and described in IEEE Transactions on Magnetics, volume 15, no. 6, Nov. 1979 at pages 1876–1879 and also in IEEE International Electron Devices meeting, Washington, D.C., Dec. 3–5, 1979 at pages 482–484.

None of the aforementioned load driving Josephson junction circuits teach or suggest voltage amplification. Accordingly, it would be desirable to provide a new and improved Josephson junction circuit which operates as a high gain voltage amplifier.

SUMMARY OF THE INVENTION

It is a principle object of the present invention to provide a novel Josephson junction voltage amplification circuit.

It is another principle object of the present invention to provide a Josephson junction amplifier having an extremely accurate and stable predeterminable output voltage which is capable of being employed as a voltage reference or standard.

It is yet another principle object of the present invention to provide a Josephson junction voltage amplifier capable of accurately amplifying and resolving the low voltage portion of a Josephson junction current vs. voltage characteristic curve.

It is another object of the present invention to provide a novel Josephson junction voltage amplifier which is substantially free from thermal noise.

It is yet another principle object of the present invention to provide a novel Josephson junction voltage amplifier capable of gains in the order of 400 to 1, thus, providing voltage outputs sufficient to drive directly room temperature integrated circuit devices such as ECL, TTL, GaAs, MOS, etc. directly without level conversion.

According to these and other objects of the present invention there is provided a single Josephson junction arranged in a single branch comprising an external source resistor outside of the cryogenic environment and an internal load resistor and a Josephson junction inside of the cryogenic environment. An input resistor inside of the cryogenic environment is connected to an input node between the load resistor and the Josephson junction. A high gain voltage output circuit is connected in parallel across the load resistor. The high gain voltage output is sensed by sensing means which sense the voltage output across the load resistor only when the Josephson junction is switching from its low impedance state to its high impedance state.

DETAILED DESCRIPTION OF THE PREFERRED EMBODIMENT

Figure 1:
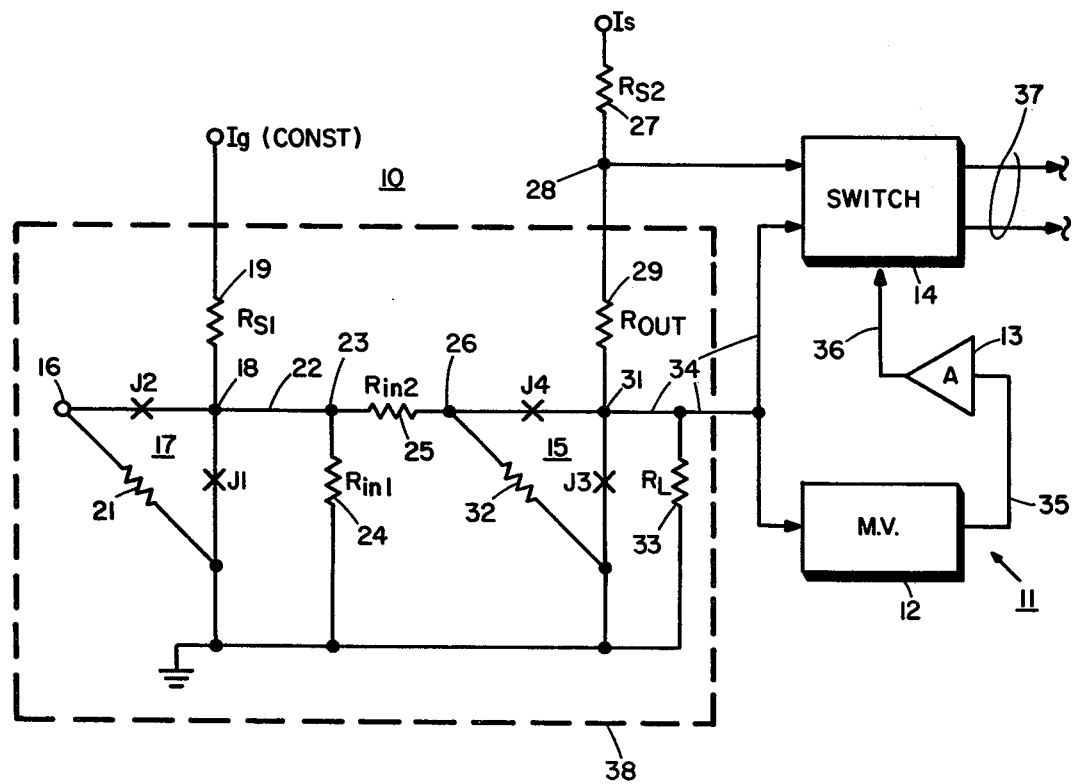
FIG. 1 is a Josephson junction circuit employing two Josephson Atto-Weber Switches (JAWS) arranged in series and having an external output sensing logic circuit.

FIG. 1 shows the present invention voltage amplifier 10 in the form in which it was originally tested. In the prior art two Josephson Atto-Weber Switches (JAWS) have been coupled in series in the manner shown, however, the novel sensing means 11 at the output comprising a one shot multivibrator 12, an amplifier 13 and a normally open voltage sampling switch 14 together with the JAWS device 15 constitute a new high gain voltage amplifier. The operation of a typical JAWS switch occurs when a constant gate current $I_g$ is being applied through a source resistor 19 ($R_{s1}$) and through a Josephson junction $J_1$ which is initially in its zero voltage state. When an additional input current is applied at node 16, it passes through Josephson junction $J_2$ to node 18 and through the Josephson junction $J_1$ to ground. The input current increases until a point is reached when a critical current $I_0$ is present in Josephson junction $J_1$ which causes it to switch from its low impedance state to its high impedance state. Switching of $J_1$ causes a portion of the gate current $I_g$ to flow through $J_2$ and through branch resistor 21 to ground. Thus, causing $J_2$ to switch and both $J_1$ and $J_2$ being in a high impedance state cause a major portion of the input current at node 16 to be diverted through resistor 21 to ground. Most of the gate current $I_g$ appearing at node 18 now appears on input line 22 to node 23. In the FIG. 1 embodiment, the resistors 24 and 25 which are labeled as $R_{in1}$ and $R_{in2}$ were chosen to be equal so that the current at node 23 was equally split into the two branches. The current $I_{in}$ which flows through resistor 25 ($R_{in2}$) develops the voltage input $V_{in}$ for the circuit tested as shown in FIG. 1. The voltage input node 26 is initially at ground since the Josephson junctions $J_3$ and $J_4$ are in the low impedance state. The input source current $I_s$ is being applied through the source resistor 27 ($R_{s2}$) to the first output node 28 and flows through the output resistor 29 to the node 31. Node 31 is also initially grounded since the Josephson junction $J_3$ and the Josephson junction $J_4$ are in their low impedance states. When the input current $I_{in}$ being applied at node 26 becomes sufficient to switch the Josephson junction $J_3$ to the high impedance state, the major portion of the current flowing through source resistor 27 and output resistor 29 to node 31 now flows through Josephson junction $J_4$ and resistor 32 to ground. Subsequently, the Josephson junction $J_4$ switches causing the source current $I_s$ to flow through load resistor 33. An increase in voltage occurs on voltage output line 34 which is applied to the one shot multivibrator 12 and the voltage sampling switch 14. The multivibrator 12 generates an output signal on line 35 which is amplified at amplifier 13 and applied via line 36 to sampling switch 14 which has normally open contacts. The signal indicative of the switching of the junctions $J_3$ and $J_4$ causes the switch 14 to close and the voltage across output resistor 29 is coupled to the voltage amplifier output lines 37.

It will be understood that at the time junctions $J_3$ and $J_4$ switch, the current $I_s$ plus the input current $I_{in}$ at node 26 are equal to the critical current $I_0$. Further, the input current $I_{in}$ at node 26 is equal to $V_{in}/R_{in2}$. In similar manner the source current $I_s$ is equal to the $V_{out}$ appearing across output resistor 29 divided by the value of the output resistor 29. Thus, $V_{out}/R_{out} + V_{in}/R_{in2} = I_0$. Rearranging the equation and solving for $V_{out}$, it will be found that $V_{out} = -(R_{out}/R_{in2})V_{in} + R_{out} I_0$. In this equation the latter value $R_{out} I_0$ is a constant; thus, the amount of voltage gain which may be obtained in the novel voltage amplifier can be as much as 400 to 1 by the proper selection of the values of the resistors $R_{out}(29)$ and $R_{in2}(25)$.

The dash lines 38 are indicative of the cryogenic container in which the Josephson junction devices are placed, therefore, it will be understood that all of the elements inside of the dash line 38 are maintained at cryogenic temperature. Sensing means 11 need not be inside of the cryogenic container 38 and preferably are maintained outside, but may be inside of the container 38.

Figure 2:
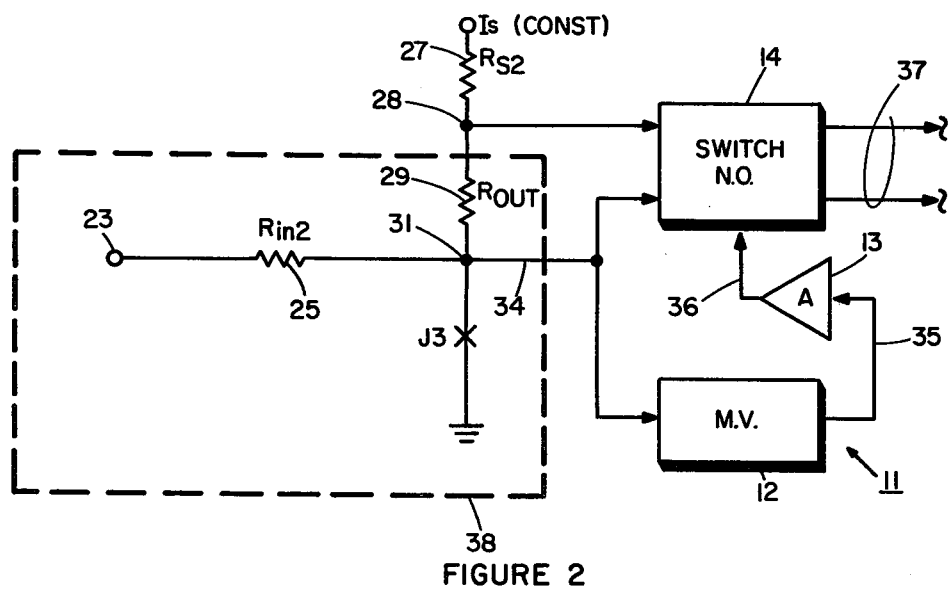
FIG. 2 is a schematic circuit showing the generic elements of the novel Josephson junction amplifier of the present invention.

Refer now to FIG. 2 showing in generic form the principle elements of a novel Josephson junction voltage amplifier. The voltage input is applied to node 23 and develops a current across input resistor 25 and appears at node 31. Initially, node 31 is at the ground condition because the Josephson junction $J_3$ is in the low impedance state. The source current $I_s$ is applied through the source resistor 27 and appears at the first output node 28. The current flows through the output resistor 29 and appears at the second output node 31 before flowing through Josephson junction $J_3$ to ground. When the Josephson junction $J_3$ switches, it goes to its high impedance state causing a voltage increase to appear at node 31. The voltage increase is sensed on line 34 and applied to multivibrator 12. The output of multivibrator 12 is amplified in amplifier 13 and applied via line 36 to the voltage sampling switch 14. The signal on line 36 causes the normally open contacts in switch 14 to close and the amplified voltage output signal is coupled to output lines 37. The gain produced by the circuit shown in FIG. 2 is substantially the same as that shown in FIG. 1 wherein the voltage gain is equal to $R_{out}(29)R_{in2}(25)$.

Figure 3:
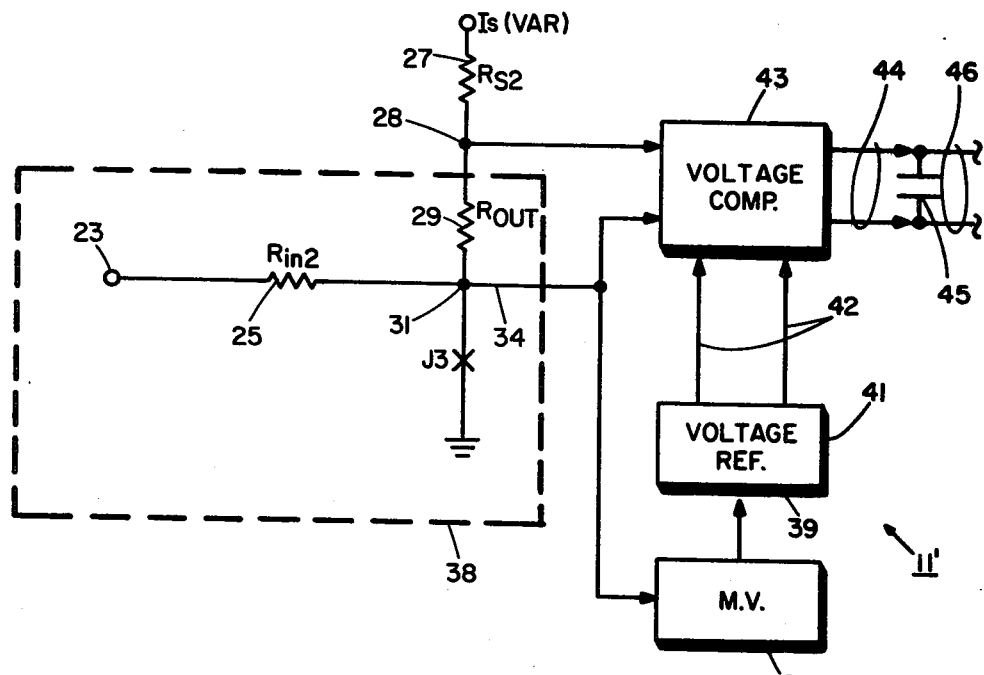
FIG. 3 is a schematic circuit showing a modified embodiment of the Josephson junction amplifier of FIG. 2.

Refer now to FIG. 3 showing a modified embodiment of FIG. 2 for use in a sample and hold application. The Josephson junction device $J_3$ inside of the cryogenic container 38 is identical to that shown in FIG. 2. The current source $I_s$ in FIG. 3 may be variable and is applied to the source resistor 27 to generate a voltage at the first output node 28 which is applied to a voltage comparator 43. The voltage at Josephson junction $J_3$ on line 34 is also applied to the voltage comparator and to the multivibrator 12 which senses the voltage change when $J_3$ switches. This generates a signal on line 39 causing the reference voltage 41 to generate an output signal on lines 42. The voltage reference output signals on lines 42 are compared with the output voltage across resistor 29 being applied to voltage comparator 43. When the output voltage across resistor 29 is changing and crosses through the value of the voltage reference on output lines 42, the output voltage is generated on output lines 44. It will be understood that the voltage on lines 44 is sensed at a particular instant in time and is not a dc voltage. If a direct voltage is desired from the output voltage comparator 43 a capacitor 45 may be placed across the lines and a dc voltage sensed at output lines 46. The formula for $V_{out} = -(R_{out}/R_{in2})V_{in} + R_{out} I_0$. The reference voltage on lines 42 is $R_{out} I_0$ and this reference voltage may be eliminated from the formula leaving $-V_{out}$ a ratio of $R_{out}/R_{in2}$. Voltage reference 41 cancels out the constant voltage term $R_{out} I_0$.

Figure 4:
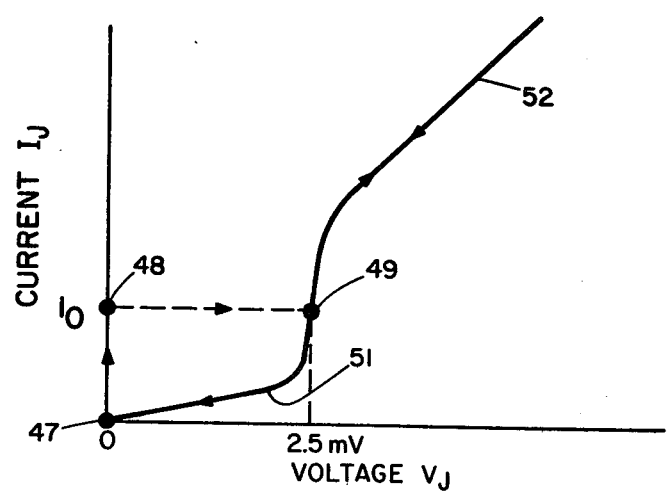
FIG. 4 is a typical current vs. voltage characteristic curve for a Josephson junction.

FIG. 4 is a typical Josephson junction device current vs. voltage characteristic curve. When the current across a typical Josephson junction is increased from the zero point 47 toward its critical current point 48, there is no voltage output across the Josephson junction. When the junction reaches its critical current state $I_0$, it shifts from zero voltage to a gap voltage shown at point 49. If the current is subsequently decreased, the voltage across the Josephson junction follows the sub gap resistance path shown as curve 51; however, if the current in the Josephson junction is subsequently increased from point 49 it follows a normal resistance path shown as curve 52. The arrows on the curves 51 and 52 indicate the direction in which the current in the junction is moving in the decreasing or increasing direction.

Figure 5:
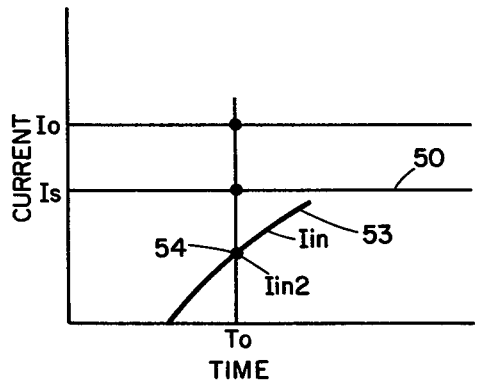
FIG. 5 is a schematic waveform of current vs. time showing a typical input signal to the Josephson junction voltage amplifier.

Refer now to FIG. 5 showing an input current waveform which may be used to explain the current vs. voltage characteristic curve of FIG. 4. Assuming that the source current $I_s$ in FIG. 2 is constant and shown at line 50, any increase in the input current $I_{in}$ shown at curve 53 is also applied to node 31 and adds to the source current so that the effect of $I_{in} + I_s$ eventually equals $I_0$ which occurs at point 54. It is possible for $I_{in}$ to increase pass the critical current point $I_0$ which would explain the normal resistance path 52 of the waveform shown in FIG. 4. It will be understood that in the novel Josephson junction amplifier circuit, the maximum voltage amplification is sensed at critical time $T_0$ when the current $I_{in2}$ plus $I_s$ is just equal to $I_0$.

Figure 6:
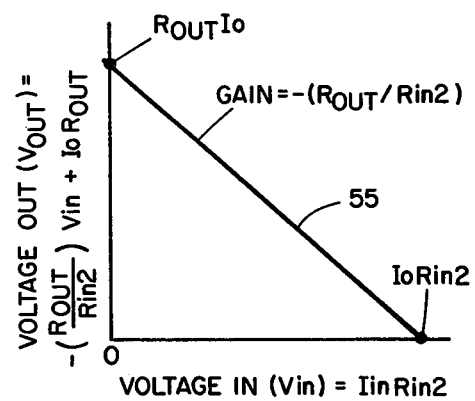
FIG. 6 is a schematic drawing showing voltage out vs. variable voltage in for the novel Josephson junction voltage amplifier.

Refer now to FIG. 6 which will assist in explaining the voltage gain achieved by the Josephson junction amplifiers of FIGS. 1 through 3. The variable input to FIG. 6 is shown as voltage in $V_{in}$ on the abscissa. The amplified voltage out $V_{out}$ is shown on the ordinate. The ratio of voltage out to voltage in is defined as the voltage amplification gain of the Josephson junction device and it is to be understood that the gain ratio is defined by the slope of the curve 55 and is equal to $-R_{out}/R_{in2}$. The novel Josephson junction voltage amplifier may be used as an amplifier or an amplifier inverter.

Figure 7:
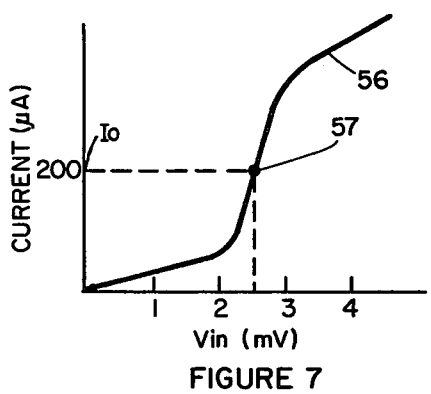
FIG. 7 is a schematic drawing showing a typical current vs. voltage characteristic for a Josephson junction without any amplification.

FIG. 7 is a schematic drawing for a current vs. voltage characteristic of a typical Josephson junction device under test. Waveform 56 shows that for a single Josephson junction device that an input current of 200 micro amperes will typically produce an output voltage of approximately 2.5 millivolts. The point 57 on curve 56 is at the critical current $I_0$ level.

Figure 8:
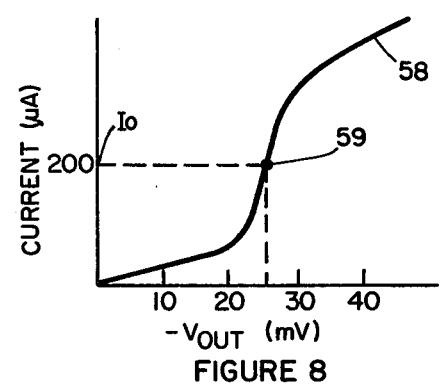
FIG. 8 is a schematic drawing showing current vs. the voltage output from a novel Josephson junction voltage amplifier.

FIG. 8 is a schematic characteristic curve of current vs. voltage of a similar Josephson junction device as shown in FIG. 7 after it has been embodied into the novel Josephson junction amplifier circuits of FIGS. 1 to 3. Curve 58 is substantially identical in shape to curve 56 except that the voltage output has been amplified by a factor of 10. Thus, at point 59 an input current of 200 micro amps is shown producing a negative output voltage of 25 millivolts when the constant voltage term $R_{out} I_0$ is cancelled out. It will be understood that the ratio of the output resistor $R_{out}$ to the input resistor $R_{in2}$ defines the gain of the novel Josephson junction voltage amplifier and may be raised to provide gains of approximately 400 to 1. Accordingly, it is now possible to amplify the low voltage portion of curve 56 where voltages of only a few microvolts are present and to detect and resolve accurately this region.

Having explained a preferred embodiment and a modification of the present invention, it will now be understood that the voltage amplifier may be embodied into numerous circuits without modification. For example, prior art logic gates employing Josephson junction devices have required room temperature amplification devices to achieve voltage levels which are compatible with the prior art utilization and sensing devices. Employing the present Josephson junction voltage amplifier, no external level shifting or amplification circuit is required.

As a second example, it is now possible to employ a single Josephson junction device embodied into a voltage regulator. A typical prior art Josephson junction voltage regulator consists of a string of Josephson junction devices in series with the voltage across the entire string being used as the regulated voltage. It is now possible using the present invention Josephson junction voltage amplifier to employ a single Josephson junction and multiply the input voltage to any reasonable multiple at least 400 times.

As a further example, the present invention Josephson junction voltage amplifier may be employed as a microwave power output device. Power translation is possible at the frequency of resonant portion of the device characteristic curve which suggests that precision oscillators with high power are now possible employing the present invention.

The present invention Josephson junction voltage amplifier may be employed with prior art magnetometer circuits to increase their sensitivity through voltage amplification. It would appear to be possible to multiply microvolt inputs up to millivolt signals with extreme accuracy. Since the amplification is occurring at cryogenic temperatures, the final stage amplification would be more accurate by approximately two orders of magnitude than amplifiers operating at room temperature because the thermal noise is proportional to the absolute temperature.

Employing the present invention Josephson junction voltage amplifier, it is now possible to perform basic computer logic operations in a cryogenic environment and to use the output from the cryogenic amplifier to drive room temperature peripheral devices directly without level converters and amplifiers.

We claim:

1. A superconducting Josephson junction voltage amplifier circuit of the type maintained in a cryogneic container during operation, comprising:
    a voltage input node in said cryogenic container for receiving a voltage input signal,
    an input impedance connected to said voltage input node,
    a single Josephson junction branch connected to said input impedance, said branch comprising in series a source resistor external to said cryogenic container, and inside said cryogenic container an output impedance and a Josephson junction device,
    said imput impedance being connected to the connection between said Josephson junction device and said output impedance,
    a current source connected to said Josephson junction branch at said source resistor,
    a first voltage output node intermedidte said external source resistor and said internal output impedance,
    a second voltage output node intermediate daid internal output impedance and said Josephson junction device,
    external voltage sensing means connected to said first and said second voltage output nodes for detecting an amplified differential voltage generated across said output impedance only when said Josephson junction device switches from a zero resistance state to a voltage gap state, and
    means for sensing when said Josephson junction device is switching connected to said external voltage sensing means.

2. A superconducting Josephson junction voltage amplifier as set forth in claim 1 wherein said voltage input signals at said voltage input node are of a predetermined level and said current source at said Josephson junction branch is maintained constant.

3. A superconducting Josephson junction voltage amplifier as set forth in claim 1 wherein said voltage input signals at said voltage input node to be amplified are of variable amplitude, and said current source at said Josephson junction branch varies during the switching of said Josephson junction device.

4. A superconducting Josephson junction amplifier as set forth in claim 1 wherein said voltage input signal at said voltage input node creates an input current greater than the critical current of said Josephson junction device.

5. A superconducting Josephson junction voltage amplifier as set forth in claim 1 wherein said external voltage sensing means comprises switch means connected to said first voltage output node and said means for sensing comprises a monostable multivibrator connected to said second output voltage node and said switch means.

6. A superconducting Josephson junction voltage amplifier as set forth in claim 5 which further includes an amplifier intermediate said monostable multivibrator and said switch means.

7. A superconducting Josephson junction voltage amplifier as set forth in claim 1 wherein said external voltage sensing means comprises a comparator connected to said first voltage output node and said means for sensing comprises a monostable multivibrator connected to said second voltage output node and a reference voltage intermediate said comparator and said monostable multivibrator.

8. A superconducting Josephson junction voltage amplifier as set forth in claim 1 wherein said external voltage sensing means further comprise a pair of amplifier output lines connected to said switch means and further includes a capacitor in parallel across said amplifier output lines for providing a direct current amplified output voltage.

9. A method of amplifying an input voltage to a superconducting Josephson junction device, comprising the steps of:
providing a Josephson junction device in a cryogenic environment,
connecting a load resistor in series with said Josephson junction device in said cryogenic environment,
providing an external source resistor in series with said load resistor and said Josephson junction device,
providing a source current at said external source resistor,
applying a voltage input signal to the connection between said Josephson junction device and said load resistor, and
sensing the amplified voltage change across said load resistor only when said Josephson junction device is changing from a zero resistant state to a voltage gap state.

* * * * *